United States Patent
Sato et al.

(10) Patent No.: US 9,172,355 B2
(45) Date of Patent: Oct. 27, 2015

(54) TRANSMISSION CIRCUIT AND SIGNAL TRANSMISSION AND RECEPTION CIRCUIT

(71) Applicants: FUJITSU LIMITED, Kawasaki-shi, Kanagawa (JP); FUJITSU SEMICONDUCTOR LIMITED, Yokohama-shi, Kanagawa (JP)

(72) Inventors: Hiroyuki Sato, Kawasaki (JP); Yoshihiko Matsuo, Kawasaki (JP)

(73) Assignees: FUJITSU LIMITED, Kawasaki (JP); FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/264,954

(22) Filed: Apr. 29, 2014

(65) Prior Publication Data

US 2014/0327494 A1    Nov. 6, 2014

(30) Foreign Application Priority Data

May 2, 2013    (JP) .................................. 2013-097008

(51) Int. Cl.

| | |
|---|---|
| *H01P 1/10* | (2006.01) |
| *H03H 11/34* | (2006.01) |
| *H03H 7/38* | (2006.01) |
| *H03H 7/42* | (2006.01) |

(52) U.S. Cl.
CPC ............... *H03H 11/348* (2013.01); *H03H 7/38* (2013.01); *H03H 7/42* (2013.01)

(58) Field of Classification Search
CPC ........................................................ H01P 1/15
USPC .......................................................... 333/103
See application file for complete search history.

(56) References Cited

U.S. PATENT DOCUMENTS

| 5,634,200 | A | 5/1997 | Kitakubo et al. | |
|---|---|---|---|---|
| 7,283,793 | B1 * | 10/2007 | McKay ........................... | 455/83 |
| 2005/0116787 | A1 | 6/2005 | Ohi et al. | |
| 2010/0321129 | A1 * | 12/2010 | Onody et al. ................. | 333/124 |
| 2013/0307742 | A1 * | 11/2013 | Hu et al. ....................... | 343/821 |

FOREIGN PATENT DOCUMENTS

| JP | 06-291696 A | 10/1994 |
|---|---|---|
| JP | 2005-166702 A | 6/2005 |

* cited by examiner

*Primary Examiner* — Daniel Puentes
(74) *Attorney, Agent, or Firm* — Arent Fox LLP

(57) ABSTRACT

A transmission circuit includes a first path that connects a first terminal for inputting or outputting signals, and one of a pair of second terminals for outputting or inputting the signals; a second path that connects the first terminal and another one of the pair of second terminals; a first circuit including a first capacitor that is serially inserted in the first path, which is configured to perform single-differential conversion on signals transmitted through the first path, to perform impedance matching, and to supply a bias voltage; a second circuit including a first inductor that is serially inserted in the second path, which is configured to perform single-differential conversion on signals transmitted through the second path, to perform impedance matching, and to supply a bias voltage; and a switch that is connected between the two terminals of the pair of second terminals.

15 Claims, 11 Drawing Sheets

TRANSMISSION CIRCUIT AND SIGNAL TRANSMISSION AND RECEPTION CIRCUIT

CROSS-REFERENCE TO RELATED APPLICATION

This patent application is based upon and claims the benefit of priority of the prior Japanese Patent Application No. 2013-097008 filed on May 2, 2013, the entire contents of which are incorporated herein by reference.

FIELD

The embodiments discussed herein are related to a transmission circuit and a signal transmission and reception circuit.

BACKGROUND

Conventionally, there is an antenna duplexer which is used by switching a single antenna by transmission signals and reception signals having different frequencies. This antenna duplexer includes a high frequency switch circuit that supplies transmission signals to the antenna, and a band limit filter that outputs reception signals output from the antenna to a predetermined reception circuit. In the band limit filter, frequency characteristics are selected such that the frequency band of the transmission signal is suppressed, and the reflected wave generated at the input terminal is maintained at a predetermined phase such that the impedance becomes high at the frequency band of the transmission signal.

Furthermore, the antenna duplexer switches the contact point of the switch circuit, and switches the transistor to an ON state at the time of transmission or switches the transistor to an ON state at the time of reception, and selectively connects the single antenna to the transmitting circuit and the receiving circuit (see, for example, Patent Document 1).

Patent Document 1: Japanese Laid-Open Patent Publication No. H06-291696

Incidentally, a conventional antenna duplexer includes a switch in the transmission path of the transmission signal or the reception signal, and therefore a loss occurs when the transmission signal or the reception signal is transmitted to the switch.

SUMMARY

According to an aspect of the embodiments, a transmission circuit includes a first path that connects a first terminal for inputting or outputting signals, and one of a pair of second terminals for outputting or inputting the signals; a second path that connects the first terminal and another one of the pair of second terminals; a first circuit including a first capacitor that is serially inserted in the first path, the first circuit being configured to perform single-differential conversion on signals transmitted through the first path, to perform impedance matching, and to supply a bias voltage; a second circuit including a first inductor that is serially inserted in the second path, the second circuit being configured to perform single-differential conversion on signals transmitted through the second path, to perform impedance matching, and to supply a bias voltage; and a switch that is connected between the one of the pair of second terminals and the other one of the pair of second terminals.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF EMBODIMENTS

Before describing a transmission circuit and a signal transmission and reception circuit according to embodiments of the present invention, a description is given of a transmission circuit according to the assumed technology.

Figure 1:
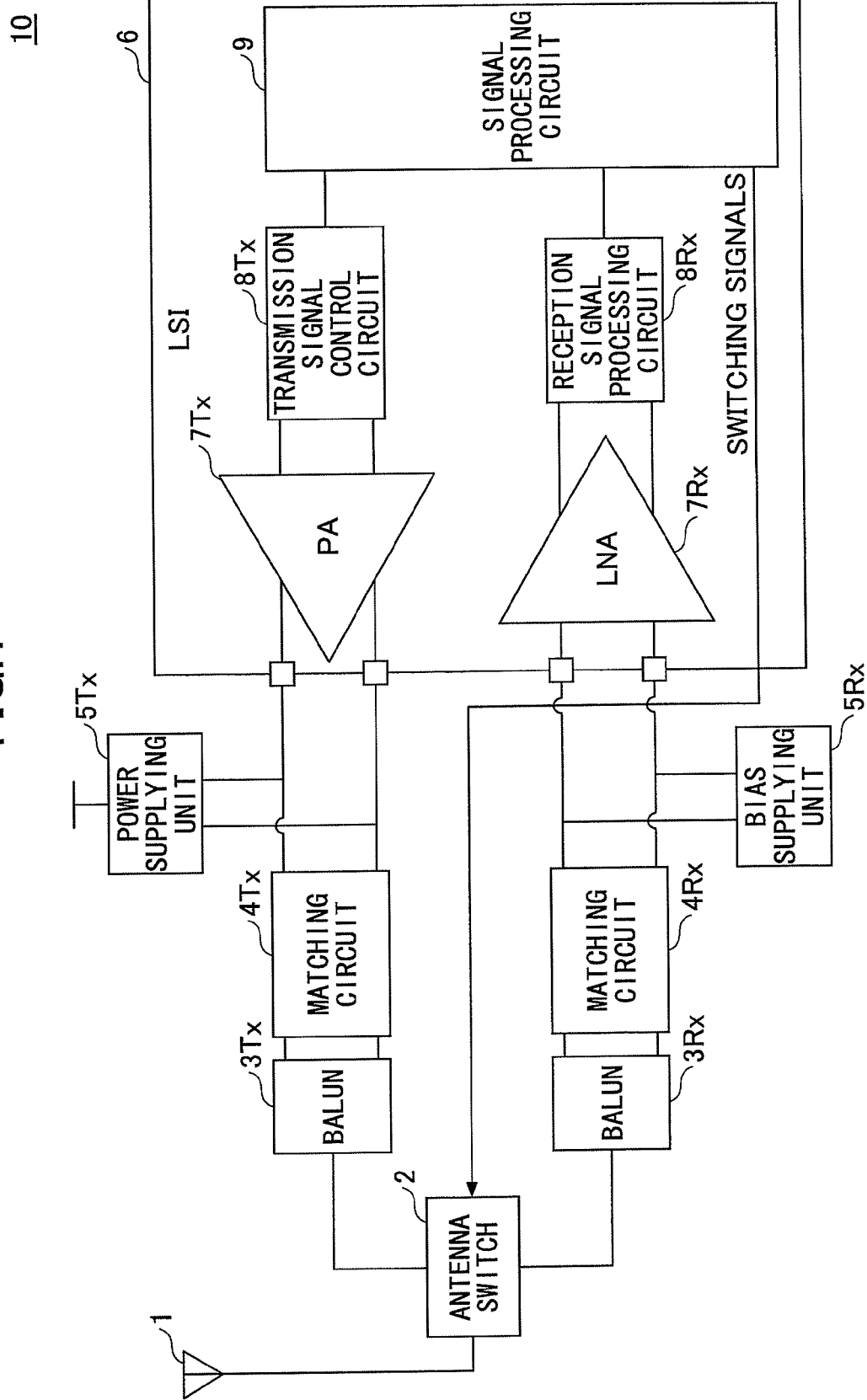
FIG. 1 illustrates an RF transceiver including a transmission circuit according to the assumed technology.

FIG. 1 illustrates an RF (Radio Frequency) transceiver 10 including a transmission circuit according to the assumed technology.

The RF transceiver 10 includes an antenna 1, a switch 2, baluns 3Tx, 3Rx, matching circuits 4Tx, 4Rx, a power supplying unit 5Tx, a bias supplying unit 5Rx, and a LSI (Large Scale Integrated circuit) 6.

The switch 2, the balun 3Tx, the matching circuit 4Tx, and the power supplying unit 5Tx construct a transmission circuit used for transmission. Furthermore, the switch 2, the balun 3Rx, the matching circuit 4Rx, and the bias supplying unit 5Rx construct a transmission circuit used for reception.

In FIG. 1, the switch 2 is indicated as a single block; however, the switch 2 may be divided into a part included in the transmission circuit used for transmission and a part included in the transmission circuit used for reception.

The antenna 1 is an antenna for performing transmission and reception of RF signals, which is connected, by the switch 2, to the transmission system including the balun 3Tx, the matching circuit 4Tx, and the power supplying unit 5Tx, and to the reception system including the balun 3Rx, the matching circuit 4Rx, and the bias supplying unit 5Rx.

The switch 2 is connected between the antenna 1 and the baluns 3Tx, 3Rx. The switch 2 is a switch for switching the connection between the antenna 1 and the transmission system including the balun 3Tx, the matching circuit 4Tx, and the power supplying unit 5Tx, or the reception system including the balun 3Rx, the matching circuit 4Rx, and the bias supplying unit 5Rx.

When transmitting RF signals from the antenna 1, the switch 2 is included in a transmission path for transmitting RF signals from the LSI 6, through the balun 3Tx, the matching circuit 4Tx, the power supplying unit 5Tx, and to the antenna 1.

Furthermore, when receiving RF signals by the antenna 1, the switch 2 is included in a transmission path for transmitting the received RF signals through the balun 3Rx, the matching circuit 4Rx, the bias supplying unit 5Rx, and to the LSI 6.

Thus, the switch 2 is demanded to have a low loss, in order to suppress the loss of RF signals. As the switch 2, for example, a switch constructed by MMIC (Monolithic Microwave Integrated Circuit) is used. As such a switch, for example, there is a GaAs switch formed by GaAs.

Note that as described above, the switch 2 may be divided into a part included in the transmission circuit used for transmission and a part included in the transmission circuit used for reception.

The baluns 3Tx, 3Rx are included in the transmission circuit of the transmission system and the transmission circuit of the reception system, respectively. The balun 3Tx converts RF signals for transmission of the differential form input from the matching circuit 4Tx, into RF signals of a single end form. Furthermore, the balun 3Rx converts RF signals of the single end form input from the switch 2, into RF signals of the differential form, and outputs the converted RF signals to the matching circuit 4Rx.

The baluns 3Tx, 3Rx are balanced/unbalanced conversion circuits for performing single-differential conversion, of converting signals of the single end form (unbalanced signals) and signals of the differential form (balanced signals). The baluns 3Tx, 3Rx are provided for the LSI 6 to handle data of the differential form.

The matching circuit 4Tx is connected between the balun 3Tx and the LSI 6, and is provided for performing impedance matching between the balun 3Tx and the LSI 6. Furthermore, the matching circuit 4Rx is connected between the balun 3Rx and the LSI 6, and is provided for performing impedance matching between the balun 3Rx and the LSI 6.

The matching circuits 4Tx, 4Rx are needed for converting the impedance of the antenna 1 and the impedance of the LSI 6. As for the RF (high frequency) signals used in the LSI 6 for wireless communication, the extent of propagation changes according to the difference in the impedance, and therefore the impedances need to be matched. For this purpose, the matching circuits 4Tx, 4Rx are provided between the antenna 1 and the LSI 6.

The power supplying unit 5Tx is inserted in a line that branches from between the matching circuit 4Tx and a PA (Power Amplifier) 7Tx of the LSI 6, to the power source, and is provided for supplying power to the PA 7Tx of the LSI 6.

The bias supplying unit 5Rx is inserted in a line that branches from between the matching circuit 4Rx and a LNA (Low Noise Amplifier) 7Rx to a reference potential point (ground), and is provided for supplying a bias of the input point to the LNA 7Rx of the LSI 6.

The LSI 6 includes the PA 7Tx, the LNA 7Rx, a transmission signal control circuit 8Tx, a reception signal processing circuit 8Rx, and a signal processing circuit 9. The PA 7Tx, the LNA 7Rx, the transmission signal control circuit 8Tx, the reception signal processing circuit 8Rx, and the signal processing circuit 9 are fabricated as one chip as the LSI 6.

The PA 7Tx is connected between the matching circuit 4Tx and the transmission signal control circuit 8Tx, and is provided for amplifying the RF signals for transmission to be transmitted from the transmission signal control circuit 8Tx to the matching circuit 4Tx.

The LNA 7Rx is connected between the matching circuit 4Rx and the reception signal processing circuit 8Rx, and is provided for amplifying RF signals received by the antenna 1 converted to the differential form and output from the matching circuit 4Rx.

The transmission signal control circuit 8Tx is a circuit for performing control of the timing, etc., when outputting, to the PA 7Tx, RF signals for transmission that have undergone a predetermined process by the signal processing circuit 9.

The reception signal processing circuit 8Rx is a circuit for performing control of the timing, etc., when inputting, to the signal processing circuit 9, RF signals input from the LNA 7Rx.

The signal processing circuit 9 is a circuit for performing superposition of data by performing a predetermined process on the RF signals for transmission, and acquires data by performing a predetermined process on the received RF signals.

Furthermore, the signal processing circuit 9 controls the switching of the switch 2, for switching between the transmission state and the reception state. The switching of the switch 2 is performed by switching signals output from the signal processing circuit 9 to the switch 2.

Figure 2:
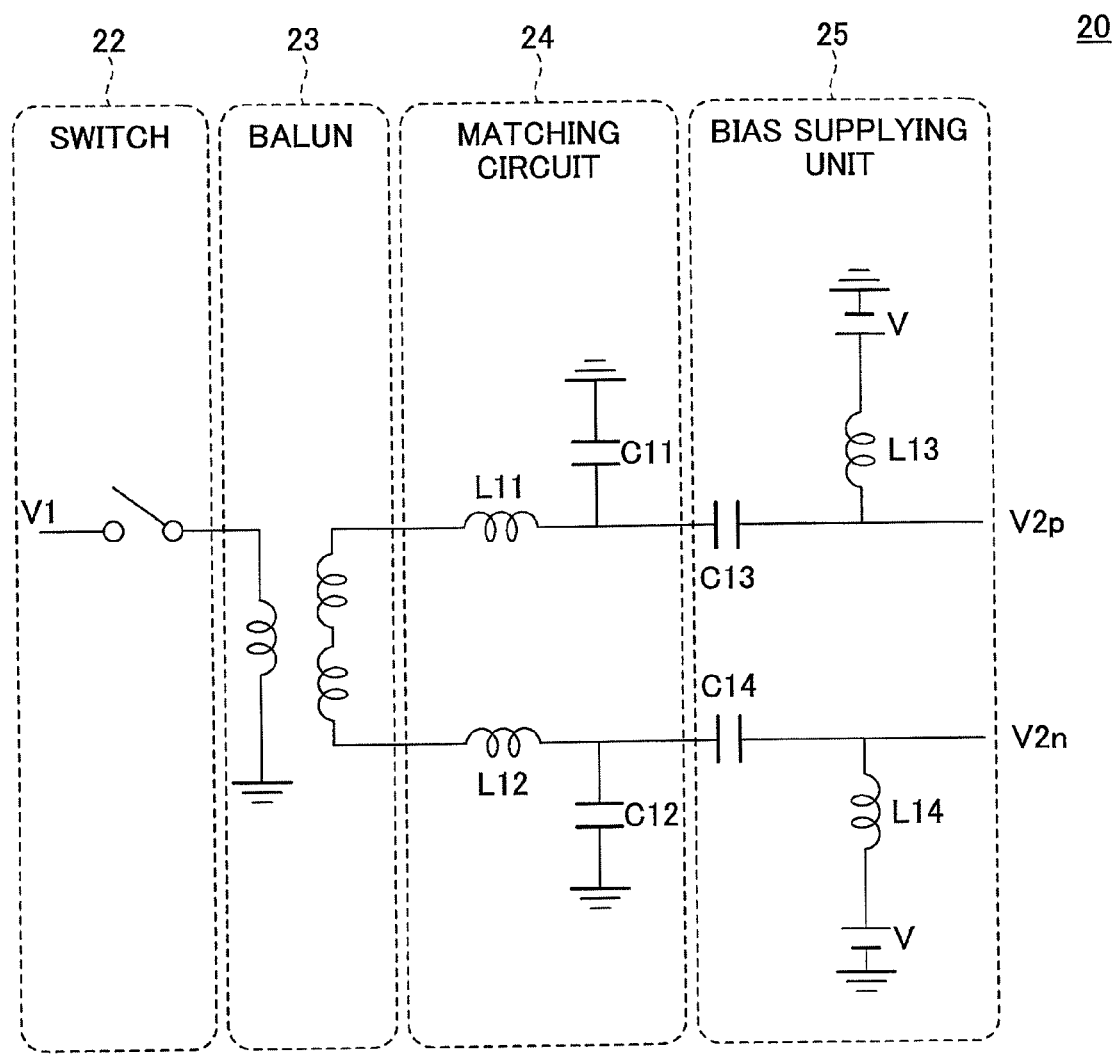
FIG. 2 illustrates an example of a transmission circuit according to the assumed technology.
Figure 3:
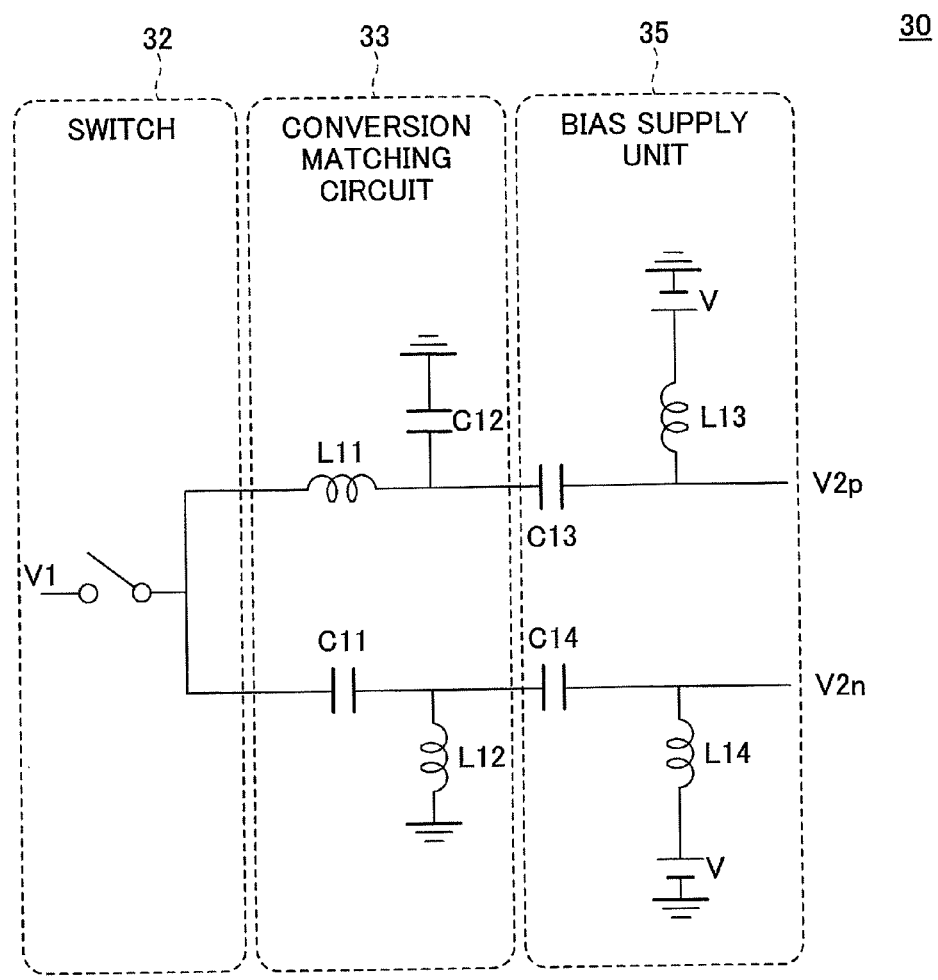
FIG. 3 illustrates an example of a transmission circuit according to another assumed technology.

Next, with reference to FIGS. 2 and 3, a description is given of a transmission circuit used for transmission and a transmission circuit used for reception, according to the assumed technology.

FIG. 2 illustrates an example of a transmission circuit according to the assumed technology.

A transmission circuit 20 according to the assumed technology of FIG. 2 includes a switch 22, a balun 23, a matching circuit 24, and a bias supplying unit 25. As for the transmission circuit 20, the circuit for transmission and the circuit for reception have the same configuration.

The transmission circuit 20 corresponds to the switch 2 (the transmission system part), the balun 3Tx, the matching circuit 4Tx, and the power supplying unit 5Tx illustrated in FIG. 1, or the switch 2 (the reception system part), the balun 3Rx, the matching circuit 4Rx, and the bias supplying unit 5Rx illustrated in FIG. 1.

In the switch 22, the antenna 1 (see FIG. 1) is connected to the terminal on the left side. The terminal on the right side of the switch 22 is connected to the balun 23. At the terminal on the left side of the switch 22, a signal V1 is input or output.

One switch 22 is included in each of the transmission circuit 20 used for transmission and the transmission circuit 20 used for reception. When sending RF signals from the antenna 1 (see FIG. 1), the switch 22 of the transmission circuit 20 used for transmission is turned on, and the switch 22 of the transmission circuit 20 used for reception is turned off.

When receiving RF signals by the antenna 1 (see FIG. 1), the switch 22 of the transmission circuit 20 used for transmission is turned off, and the switch 22 of the transmission circuit 20 used for reception is turned on.

When the switch 22 is turned off, the part between the terminal on the left side of the switch 22 and the two terminals on the right side of the bias supplying unit 25 becomes High-Z, and is blocked.

The balun 23 is a transformer, and one coil on the primary side (left side as viewed in FIG. 2) is connected to the switch 22, and two coils on the secondary side (right side as viewed in FIG. 2) are connected to the matching circuit 24. The balun 23 performs single-differential conversion by the one coil on the primary side (left side as viewed in FIG. 2) and the two coils on the secondary side (right side as viewed in FIG. 2).

The matching circuit 24 is an LC type matching circuit including inductors L11, L12, and capacitors C11, C12. The inductor L11 and the capacitor C11 transmit one of the signals of the differential form, and the inductor L12 and the capacitor C12 transmit the other one of the signals of the differential form. Note that the inductors L11, L12 have equal inductances, and the capacitors C11, C12 have equal capacitances.

The bias supplying unit 25 includes capacitors C13, C14, inductors L13, L14, and two power sources V. The capacitors C13, C14 are provided for DC interruption, and the inductors L13, L14 are provided for supplying a DC voltage of the power source V.

At the two terminals on the right side of the bias supplying unit 25, signals of the differential form V2p (positive), V2n (negative) are input or output.

When such a transmission circuit 20 transmits RF signals, signals of the differential form V2p, V2n are input to the two terminals on the right side of the bias supplying unit 25, a signal V1 is output from the terminal on the left side of the switch 22, and RF signals are radiated from the antenna 1 (see FIG. 1).

Furthermore, when the transmission circuit 20 receives RF signals, the received signal V1 is input to the terminal on the left side of the switch 22, and signals of the differential form V2p, V2n are output from the two terminals on the right side of the bias supplying unit 25.

Such a transmission circuit 20 includes the switch 22 in a transmission path of RF signals when transmitting or receiving RF signals. Therefore, when transmitting and receiving RF signals, a loss of RF signals occurs. Even in a case where a GaAs switch having low loss is used as the switch 22, a loss of approximately 0.2 dB through approximately 0.5 dB occurs.

Next, with reference to FIG. 3, a description is given of a transmission circuit according to another assumed technology, which is a modification of the circuit in FIG. 2.

FIG. 3 illustrates an example of a transmission circuit 30 according to another assumed technology.

The transmission circuit 30 includes a switch 32, a conversion matching circuit 33, and a bias supply unit 35. As for the transmission circuit 30, the circuit for transmission and the circuit for reception have the same configuration.

The transmission circuit 30 includes, instead of the balun 23 and the matching circuit 24 illustrated in FIG. 2, the conversion matching circuit 33, in which the balun 23 and the matching circuit 24 illustrated in FIG. 2 are combined. Therefore, the number of components is reduced. Thus, the configurations of the switch 32 and the bias supply unit 35 are the same as those of the switch 22 and the bias supplying unit 25 illustrated in FIG. 2, respectively.

The conversion matching circuit 33 includes inductors L11, L12, and capacitors C11, C12. The conversion matching circuit 33 includes two lines connected to the terminal on the right side of the switch 32, and the inductor L11 and the capacitor C11 are respectively serially inserted in the two lines.

The capacitor C12 is serially inserted in a branch line that branches from between the inductor L11 and the capacitor 13 of the bias supply unit 35, to the ground potential point. The inductor L12 is serially inserted in a branch line that branches from between the capacitor C11 and the capacitor C14 of the bias supply unit 35, to the ground potential point.

The conversion matching circuit 33 is constructed such that the inductor L11 and the inductor L12 have equal inductances, and the capacitor C11 and the capacitor C12 have equal capacitances.

By the above circuit configuration, the conversion matching circuit 33 realizes single-differential conversion and impedance matching.

Operations of the transmission circuit 30 having the above circuit configuration are the same as the operations of the transmission circuit 20.

That is to say, when the transmission circuit 30 transmits RF signals, signals V2p, V2n of the differential form are input to the two terminals on the right side of the bias supply unit 35, a signal V1 is output from the terminal on the left side of the switch 32, and RF signals are radiated from the antenna 1 (see FIG. 1).

Furthermore, when the transmission circuit 30 receives RF signals, the received signal V1 is input to the terminal on the left side of the switch 32, and signals of the differential form V2p, V2n are output from the two terminals on the right side of the bias supplying unit 35.

Similar to the transmission circuit 20 illustrated in FIG. 2, the transmission circuit 30 includes the switch 32 in a transmission path of RF signals when transmitting or receiving RF signals. Therefore, when transmitting and receiving RF signals, a loss of RF signals occurs. Even in a case where a GaAs switch having low loss is used as the switch 32, a loss of approximately 0.2 dB through approximately 0.5 dB occurs.

For example, when there is a loss of 0.5 dB due to the switch 22 or 32 in the signal path, when receiving RF signals, the receiving sensitivity deteriorates by 0.5 dB. In order to improve the receiving sensitivity by 0.5 dB, the current of the LNA 7Rx (see FIG. 1) needs to be increased, and for this purpose, the transformer conductance of the LNA 7Rx (see FIG. 1) needs to be increased by 1.2 times, i.e., the current needs to be increased by 1.4 times.

Furthermore, when transmitting RF signals, the power output from the LSI 6 (see FIG. 1) needs to be excessive by 0.5 dB. Therefore, the power is increased by 12.2%.

As described above, as for the transmission circuits 20 and 30 illustrated in FIGS. 2 and 3, in either case, the switch 22, 32 is included in the signal path.

Therefore, the loss at the switch 22, 32 occupies a large ratio with respect to the power consumption of the entire LSI 6, and therefore the impact of the current increase is not negligible.

Accordingly, in the first and second embodiment described below, a transmission circuit and a signal transmission and reception circuit are provided, in which the loss in the signal path is reduced.

A transmission circuit and a signal transmission and reception circuit according to embodiments of the present invention will be explained below with reference to accompanying drawings.

First Embodiment

Figure 4:
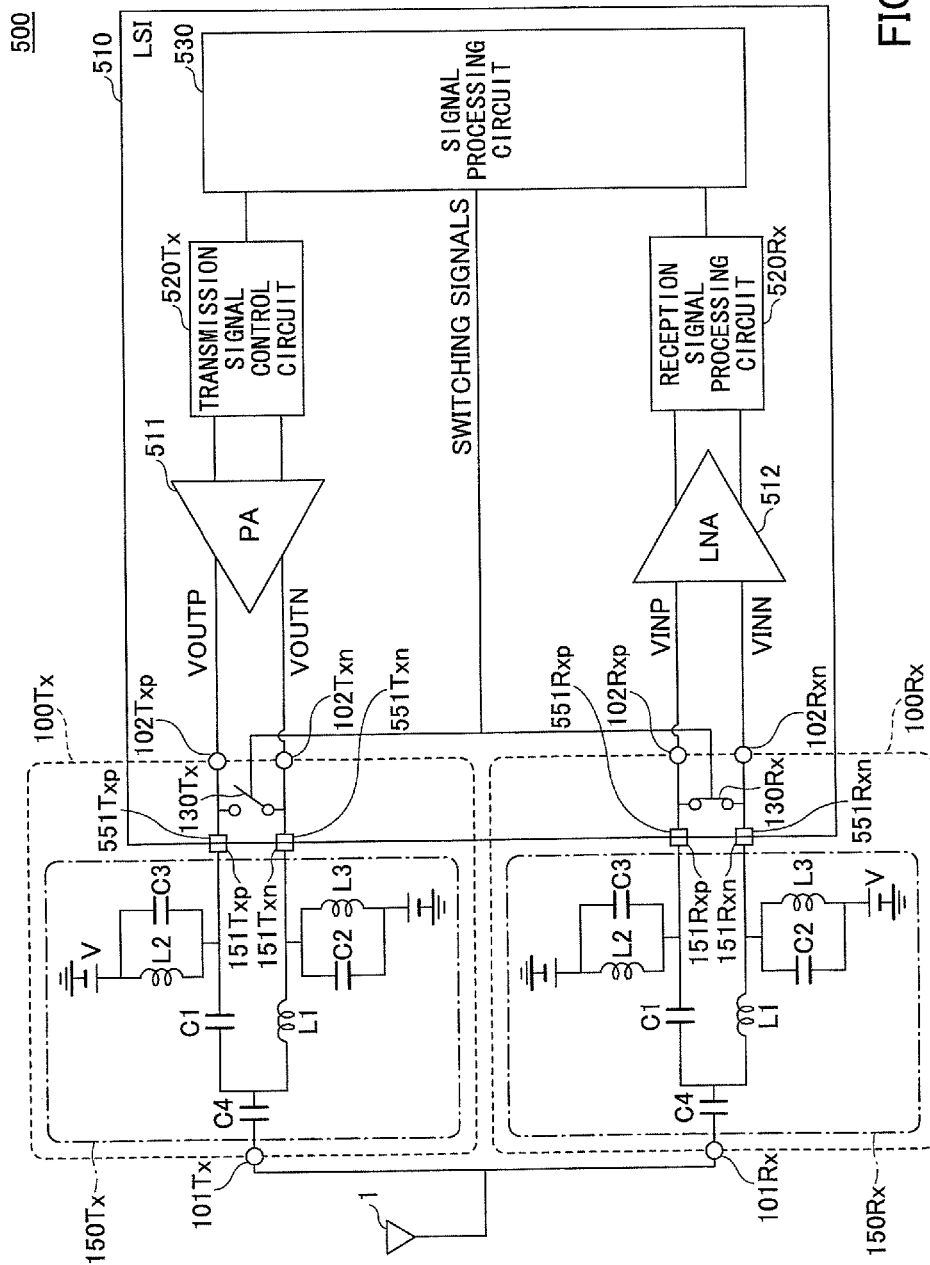
FIG. 4 illustrates an RF transceiver including transmission circuits according to a first embodiment.

FIG. 4 illustrates an RF (Radio Frequency) transceiver 500 including transmission circuits 100Tx, 100Rx according to the first embodiment.

The RF transceiver 500 includes an antenna 1, the transmission circuits 100Tx, 100Rx, and a LSI (Large Scale Integrated circuit) 510. The RF transceiver 500 is an example of a signal transmission and reception circuit.

It is assumed that the frequency of RF signals transmitted by the transmission circuit 100Tx and the frequency of the transmission circuit 100Rx are in the same frequency band.

The "same frequency band" means that, for example, the frequency band, in which the value of a S11 parameter expressing the transmission properties of signals becomes less than or equal to a predetermined value, is the same, or that such frequency bands overlap. Furthermore, the "same frequency band" means that, for example, the frequency band, in which the value of a S21 parameter expressing the transmission properties of signals becomes greater than or equal to a predetermined value, is the same, or that such frequency bands overlap.

Among the configuration elements of the transmission circuits 100Tx, 100Rx, switches 130Tx, 130Rx are included in the LSI 510. That is to say, the switches 130Tx, 130Rx are included in the chip of the LSI 510, and are realized as part of a semiconductor integrated circuit.

The transmission circuit 100Tx includes terminals 101Tx, 102Txp, 102Txn, a circuit 150Tx, and a switch 130Tx. Similarly, the transmission circuit 100Rx includes terminals 101Rx, 102Rxp, 102Rxn, a circuit 150Rx, and a switch 130Rx.

The circuit 150Tx is the part that remains after removing the switch 130Tx and the terminals 101Tx, 102Txp from the transmission circuit 100Tx, and is constructed not by an LSI but by electronic components such as capacitors (C1, C2, C3), inductors (L1, L2, L3), and a DC power source (V).

Similarly, the circuit 150Rx is the part that remains after removing the switch 130Rx and the terminals 102Rxp, 102Rxn from the transmission circuit 100Rx, and is constructed not by an LSI but by electronic components such as capacitors (C1, C2, C3), inductors (L1, L2, L3), and a DC power source (V).

Therefore, in other words, the RF transceiver 500 includes the antenna 1, the circuit 150Tx, the circuit 150Rx, and the LSI 510.

The antenna 1 is connected to the terminal 101Tx of the transmission circuit 100Tx and the terminal 101Rx of the transmission circuit 100Rx. Furthermore, the terminals 102Txp, 102Txn of the transmission circuit 100Tx are connected to a pair of output terminals of a PA (Power Amplifier) 511. The terminals 102Rxp, 102Rxn of the transmission circuit 100Rx are connected to a pair of input terminals of a LNA (Low Noise Amplifier) 512.

Furthermore, terminals 151Txp, 151Txn of the circuit 150Tx are connected to terminals 551Txp, 551Txn of the LSI 510, respectively. Similarly, terminals 151Rxp, 151Rxn of the circuit 150Rx are connected to terminals 551Rxp, 551Rxn of the LSI 510, respectively.

The LSI 510 includes the switches 130Tx, 130Rx, the PA 511, the LNA 512, a transmission signal control circuit 520Tx, a reception signal processing circuit 520Rx, a signal processing circuit 530, and the terminals 551Txp, 551Txn, 551Rxp, 551Rxn.

The LSI 510 is realized as a chip of a single semiconductor integrated circuit device. For example, the LSI 510 is constructed by CMOS (Complementary Metal Oxide Semiconductor) transistors. In this case, the PA 511, the LNA 512, the transmission signal control circuit 520Tx, the reception signal processing circuit 520Rx, the signal processing circuit 530, and the terminals 551Txp, 551Txn, 551Rxp, 551Rxn are constructed by the CMOS transistors. Furthermore, the switches 130Tx, 130Rx are constructed by PMOS (P-channel Metal Oxide Semiconductor) transistors or NMOS (N-channel Metal Oxide Semiconductor) transistors included in the CMOS transistors.

The PA 511 is provided between the transmission signal control circuit 520Tx and the transmission circuit 100Tx, and amplifies RF signals of the differential form input from the transmission signal control circuit 520Tx, and inputs the amplified RF signals in the transmission circuit 100Tx.

The LNA 512 is provided between the transmission circuit 100Rx and the reception signal processing circuit 520Rx, and amplifies RF signals that are received by the antenna 1 converted to the differential form and output from the transmission circuit 100Rx, and inputs the amplified RF signals in the reception signal processing circuit 520Rx.

The transmission signal control circuit 520Tx is a circuit for controlling the timing, etc., when outputting, to the PA 511, the RF signals for transmission which have undergone a predetermined process by the signal processing circuit 530.

The reception signal processing circuit 520Rx is a circuit for performing a process of controlling the timing, etc., when inputting, to the signal processing circuit 530, the RF signals input from the LNA 512.

The signal processing circuit 530 is a circuit for superposing data by performing a predetermined process on the RF signals for transmission, and for acquiring data by performing a predetermined process on the received RF signals.

Furthermore, the signal processing circuit 530 controls the switching of the switches 130Tx, 130Rx for switching between the transmission state and the reception state. The signal processing circuit 530 turns the switch 130Tx on and turns the switch 130Rx off when switching to the transmission state, and turns the switch 130Tx off and turns the switch 130Rx on when switching to the reception state. The switching of the switches 130Tx, 130Rx is performed by switching signals output from the signal processing circuit 530 to the switches 130Tx, 130Rx.

Figure 5:
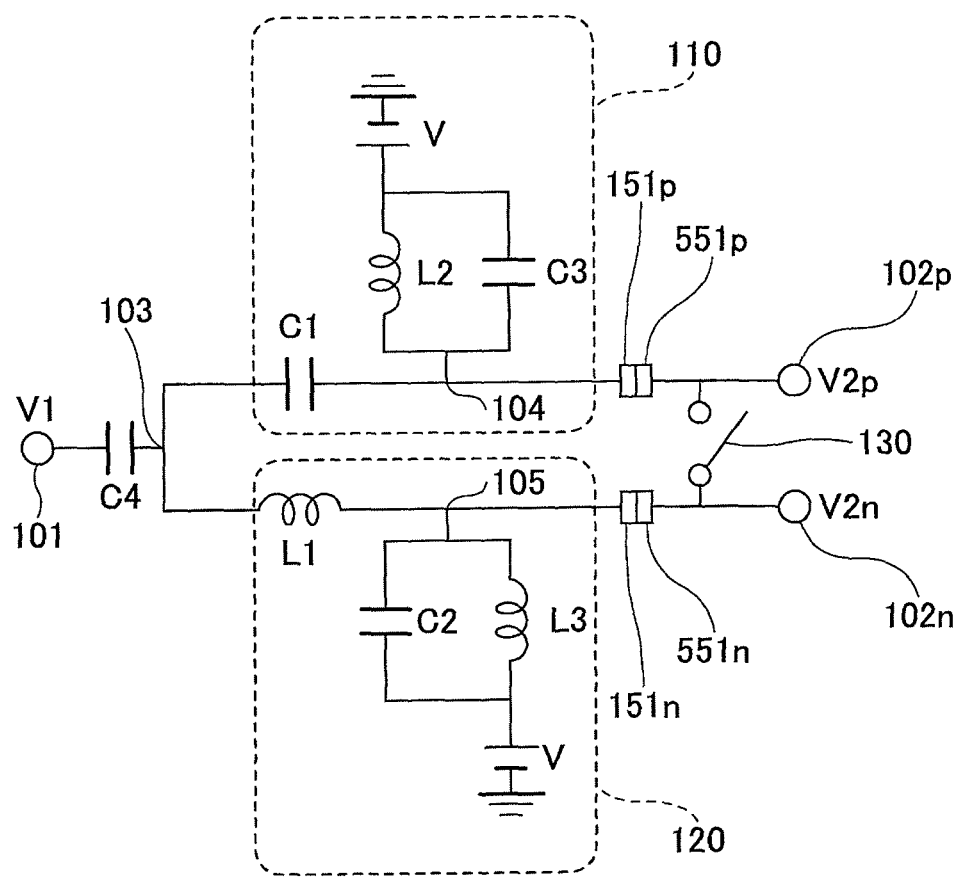
FIG. 5 illustrates the transmission circuit according to the first embodiment.

Next, with reference to FIG. 5, a description is given of the transmission circuits 100Tx, 100Rx. Note that the transmission circuits 100Tx, 100Rx have the same configuration, and therefore in the following description, the transmission circuits 100Tx, 100Rx are referred to as the transmission circuit 100 when not distinguished from each other.

FIG. 5 illustrates the transmission circuit 100 according to the first embodiment.

The transmission circuit 100 includes terminals 101, 102$p$, 102$n$, circuits 110, 120, a switch 130, and a capacitor C4. Among these, the circuits 110, 120 and the capacitor C4 correspond to the circuit 150Tx of the transmission circuit 100Tx and the circuit 150Rx of the transmission circuit 100Rx, illustrated in FIG. 4.

Furthermore, between the circuits 110, 120 and the switch 130, terminals 151$p$, 151$n$, 551$p$, 551$n$ are provided. The terminals 151$p$, 151$n$, 551$p$, 551$n$ correspond to the terminals 151Txp, 151Txn, 551Txp, 551Txn, and 151Rxp, 151Rxn, 551Rxp, 551Rxn in FIG. 4.

The transmission circuit 100 includes a signal path between the terminal 101 and the terminal 102$p$, and a signal path between the terminal 101 and the terminal 102$n$. The terminal 101 is an example of a first terminal, and the terminals 102$p$, 102$n$ are examples of a second terminal.

A signal path between the terminal 101 and the terminal 102$p$ is an example of a first path, and a signal path between the terminal 101 and the terminal 102$n$ is an example of a second path. The signal path between the terminal 101 and the terminal 102$p$ and the signal path between the terminal 101 and the terminal 102$n$ branch at a branch point 103.

The circuit 110 includes capacitors C1, C3, an inductor L2, and a DC power source V. The circuit 110 is an example of a first circuit.

The capacitor C1 is serially inserted in the signal path between the terminal 101 and the terminal 102$p$. More specifically, the capacitor C1 is serially inserted in the signal path between the branch point 103 and the terminal 102$p$.

The capacitor C3 and the inductor L2 are connected in parallel. The parallel circuit including the capacitor C3 and the inductor L2 is serially inserted in a branch path branching to the ground potential point, from a branch point 104 between the capacitor C1 and the terminal 102$p$.

The DC power source V is serially inserted in a branch path between the parallel circuit including the capacitor C3 and the inductor L2, and the ground potential point. The positive polarity terminal of the DC power source V is connected to a parallel circuit including the capacitor C3 and the inductor L2, and the negative polarity terminal of the DC power source V is connected to the ground potential point.

Note that the branch path between the branch point 104 and the ground potential point is an example of a first branch path, and the ground potential point is an example of a reference potential point.

Furthermore, the capacitor C1 is an example of a first capacitor, the capacitor C3 is an example of a second capacitor, and the inductor L2 is an example of a second inductor.

The circuit 120 includes a capacitor C2, inductors L1, L3, and a DC power source V. The circuit 120 is an example of a second circuit.

The inductor L1 is serially inserted in the signal path between the terminal 101 and the terminal 102n. More specifically, the inductor L1 is serially inserted in the signal path between the branch point 103 and the terminal 102n.

The capacitor C2 and the inductor L3 are connected in parallel. The parallel circuit including the capacitor C2 and the inductor L3 is serially inserted in a branch path branching to the ground potential point, from a branch point 105 between the inductor L1 and the terminal 102n.

The DC power source V is serially inserted in a branch path between the parallel circuit including the capacitor C2 and the inductor L3, and the ground potential point. The positive polarity terminal of the DC power source V is connected to a parallel circuit including the capacitor C2 and the inductor L3, and the negative polarity terminal of the DC power source V is connected to the ground potential point.

Note that the branch path between the branch point 105 and the ground potential point is an example of a second branch path, and the ground potential point is an example of a reference potential point.

Furthermore, the capacitor C2 is an example of a third capacitor, the inductor L1 is an example of a first inductor, and the inductor L3 is an example of a third inductor.

The switch 130 is connected between the terminals 102p and 102n. That is to say, one end of the switch 130 (terminal on top side in FIG. 5) is connected between the branch point 104 and the terminal 102p, and the other end of the switch 130 (terminal on bottom side in FIG. 5) is connected between the branch point 105 and the terminal 102n. The switch 130 is controlled to turn on/off by switching signals output from the signal processing circuit 530 illustrated in FIG. 4.

The capacitor C4 is connected between the terminal 101 and the branch point 103. The capacitor C4 is an example of a fourth capacitor.

In such a transmission circuit 100, the impedance of the capacitor C1 is equal to the impedance of the parallel circuit including the capacitor C2 and the inductor L3. Furthermore, the impedance of the inductor L1 is equal to the impedance of the parallel circuit including the inductor L2 and the capacitor C3.

The purpose of the above is to match the impedance between the antenna 1 (see FIG. 4) connected to the terminal 101 and the LSI 510 (see FIG. 4).

Furthermore, considering a circuit from which the capacitor C3 and the inductor L3 are removed, the pair of the capacitor C1 and the inductor L2 and the pair of the inductor L1 and the capacitor C2 have a function of a balun for converting signals in the single end form and signals in the differential form.

That is to say, the capacitor C1 and the inductor L2 advance the phase of the signals input from the terminal 102p by 90 degrees. Meanwhile, the inductor L1 and the capacitor C2 delay the phase of the signals input from the terminal 102n by 90 degrees.

To the terminals 102p and 102n, a pair of signals of the differential form are input. The pair of signals of the differential form have phases that are substantially different from each other by 180 degrees.

Therefore, when a pair of signals of the differential form are input from the terminals 102p and 102n, the phase of the signal of the positive side of the pair of signals of the differential form is advanced by 90 degrees by the capacitor C1 and the inductor L2. Furthermore, the phase of the signal of the negative side of the pair of signals of the differential form is delayed by 90 degrees by the inductor L1 and the capacitor C2.

Therefore, a signal obtained by advancing, by 90 degrees, the phase of a signal on the positive side input from the terminal 102p, is input in the branch point 103, and a signal obtained by delaying, by 90 degrees, the phase of a signal on the negative side input from the terminal 102n is input in the branch point 103.

The signal obtained by advancing, by 90 degrees, the phase of a signal on the positive side input from the terminal 102p, and the signal obtained by delaying, by 90 degrees, the phase of a signal on the negative side input from the terminal 102n, have the same phase.

Therefore, by the pair of the capacitor C1 and the inductor L2 and the pair of the inductor L1 and the capacitor C2, it is possible to convert the signals of the differential form input from the terminals 102p, 102n into signals of the single end form.

Furthermore, in a case where signals of the single end form are input from the terminal 101, by the opposite operation to that described above, the signals of the single end form are converted into signals of the differential form.

As described above, by the pair of the capacitor C1 and the inductor L2 and the pair of the inductor L1 and the capacitor C2, it is possible to perform single-differential conversion.

Incidentally, without the inductor L3, it is not possible to input, in the branch point 105, the DC voltage output from the DC power source V of the circuit 120, and it is not possible to supply a DC bias to the signals input or output at the terminal 102n.

Therefore, the inductor L3 is provided, to realize a path for supplying the DC voltage output from the DC power source V of the circuit 120, to the terminal 102n.

Furthermore, by adding the inductor L3 to the circuit 120, impedance matching is not attained between the circuit 110 and the circuit 120, and therefore the capacitor C3 is provided in the circuit 110.

In the circuit 110, the DC voltage output from the DC power source V of the circuit 110 is supplied through the inductor L2 and the branch point 104, to the terminal 102p.

According to the above reasons, the circuit 110 includes the capacitors C1, C3, the inductor L2, and the DC power source V, and the circuit 120 includes the capacitor C2, the inductors L1, L3, and the DC power source V.

Furthermore, the impedance of the capacitor C1 is equal to the impedance of the parallel circuit including the capacitor C2 and the inductor L3, and the impedance of the inductor L1 is equal to the impedance of the parallel circuit including the inductor L2 and the capacitor C3.

The circuits 110, 120 having the above circuit configuration are circuits for performing single-differential conversion of signals and impedance matching, and for supplying a bias voltage.

Furthermore, the capacitor C4 is for interrupting, with respect to the terminal 101, the DC voltage that is supplied to the branch point 103 from the DC power source V of the circuit 120 through the inductors L3, L1.

Here, a description is given of values that are examples of a frequency (resonance frequency) of RF signals transmitted by the transmission circuit 100, a characteristic impedance at the terminal 101, and an impedance between the terminal 102p and the terminal 102n.

For example, it is assumed that the frequency (resonance frequency) f of the RF signals transmitted by the transmission circuit 100 is 430 MHz. Furthermore, it is assumed that the characteristic impedance Z1 at the terminal 101 is 50Ω, and that the impedance Z2 between the terminal 102p and the terminal 102n is 1200 Ω.

Assuming that the capacitance of the capacitor C1 is C1, and the inductance of the inductor L1 is L1, Z1 and L1 are expressed by the following formulas. Note that ω is the angular frequency ω=2πf.

$$Z1=Z2/\{1+(\omega*C1*Z2)^2\} \quad (1)$$

$$L1=C1*Z2^2/\{1+(\omega*C1*Z2)^2\} \quad (2)$$

Here, assuming that $1<<(\omega*C1*Z2)^2$ in formulas (1) and (2), formulas (1) and (2) may be modified as formulas (3) and (4) below.

$$Z1=1/\omega^2*C1^2*Z \quad (3)$$

$$L1=1/\omega^2*C1 \quad (4)$$

C1, L1 may be set to values that satisfy formulas (3) and (4).

Furthermore, the capacitance (C2, C3) of the capacitors C2, C3, and the inductance (L2, L3) of the inductors L2, L3 are to be set as values satisfying the following formulas (5) and (6).

$$1/(\omega L1)=1/(\omega*L2)-\omega*C3 \quad (5)$$

$$\omega C1=\omega*C2-1/(\omega*L3) \quad (6)$$

Figure 6A:
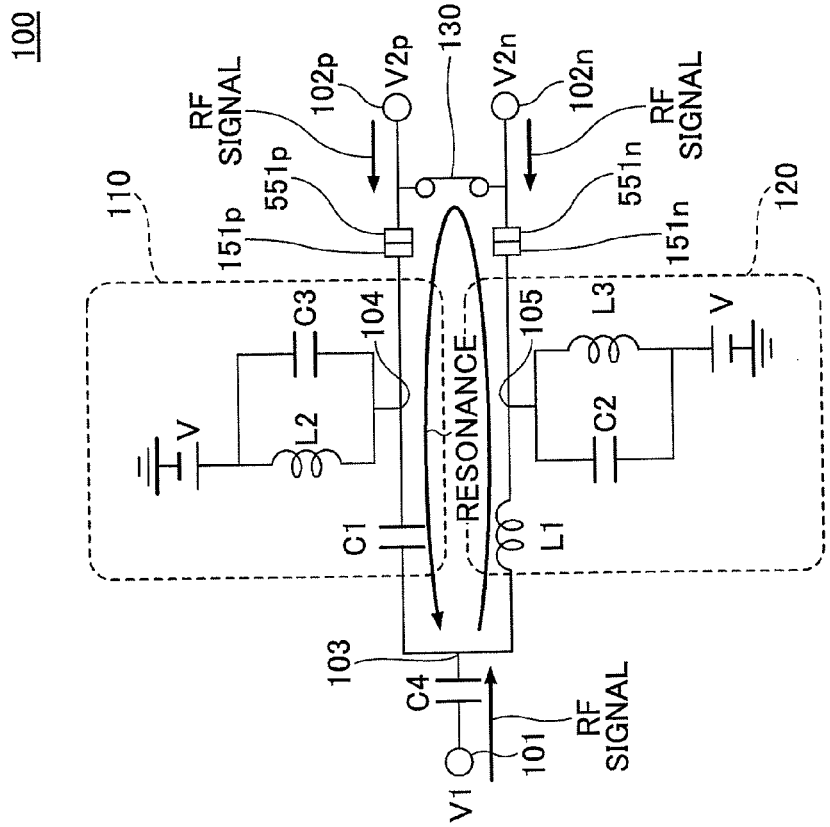
FIGS. 6A and 6B illustrate the flow of signals in the transmission circuit according to the first embodiment.
Figure 6B:
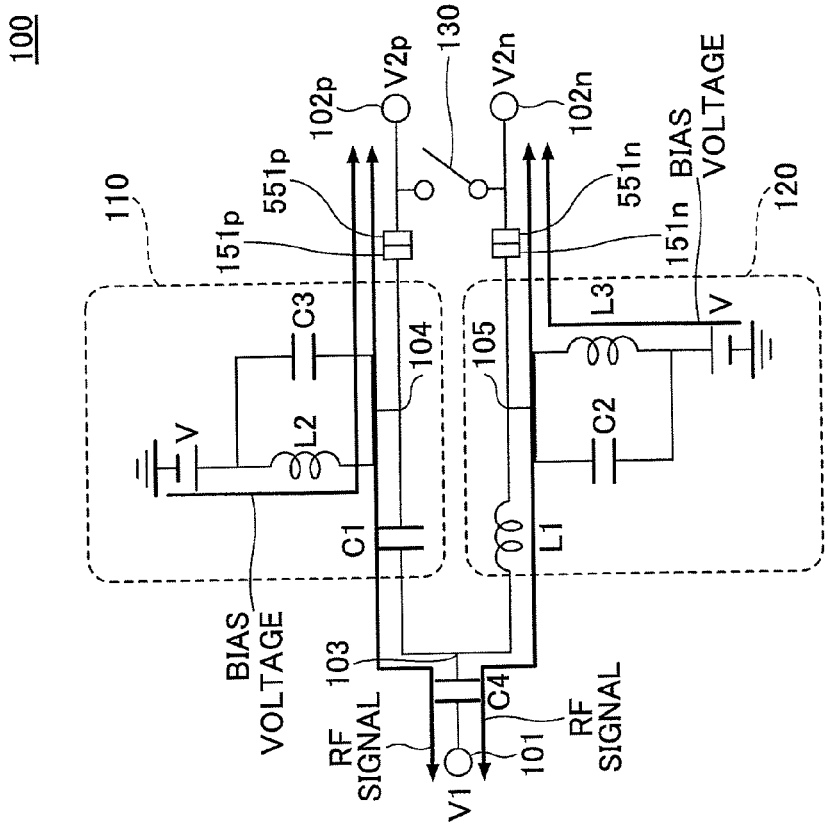

Here, with reference to FIGS. 6A and 6B, a description is given of the flow of signals in the cases where the switch 130 is on and off.

FIGS. 6A and 6B illustrate the flow of signals in the transmission circuit 100 according to the first embodiment. FIG. 6A illustrates an operation when the switch 130 is off, and FIG. 6B illustrates an operation when the switch 130 is on.

As illustrated in FIG. 6A, when the switch 130 of the transmission circuit 100 is off, it is possible to transmit RF signals in a bidirectional manner between the terminal 101 and the terminals 102p, 102n.

That is to say, it is possible to convert the RF signals of the single end form input to the terminal 101 into RF signals of the differential form, and output the converted RF signals from the terminals 102p, 102n. Furthermore, conversely, it is possible to convert the RF signals of the differential form input to the terminals 102p, 102n into RF signals of the single end form, and output the converted RF signals from the terminal 101.

Furthermore, when the switch 130 is off, when the RF signals are transmitted in either direction, it is possible to supply a bias voltage from the DC power source V to the terminals 102p, 102n.

Furthermore, as illustrated in FIG. 6B, when the switch 130 of the transmission circuit 100 is on, a loop type LC resonance circuit including the capacitor C1 and the inductor L1 is constructed. This LC loop circuit is realized by a loop circuit that extends from the switch 130, through the branch point 104, the capacitor C1, the branch point 103, the inductor L1, the branch point 105, and back to the switch 130.

In the transmission circuit 100 according to the first embodiment, the resonance frequency that is determined by the capacitance of the capacitor C1 and the inductance of the inductor L1 is set so as to be equal to the resonance frequency of the RF signals transmitted by the transmission circuit 100.

The purpose of this is to achieve High-Z (high impedance) between the terminal 101 and the terminals 102p, 102n by generating a resonance in the loop type LC resonance circuit including the capacitor C1 and the inductor L1, when the switch 130 of the transmission circuit 100 is turned on and RF signals are input from the terminal 101 or the terminals 102p, 102n.

By achieving High-Z between the terminal 101 and the terminals 102p, 102n in a state where the switch 130 of the transmission circuit 100 is turned on, RF signals do not flow between the terminal 101 and the terminals 102p, 102n.

Accordingly, by turning off the switch 130 in the transmission circuit 100 according to the first embodiment, it is possible to transmit RF signals between the terminal 101 and the terminals 102p, 102n, perform single-differential conversion, and supply a bias.

Furthermore, in the transmission circuit 100 according to the first embodiment, by turning the switch 130 on, it is possible to block the part between the terminal 101 and the terminals 102p, 102n.

Figure 7:
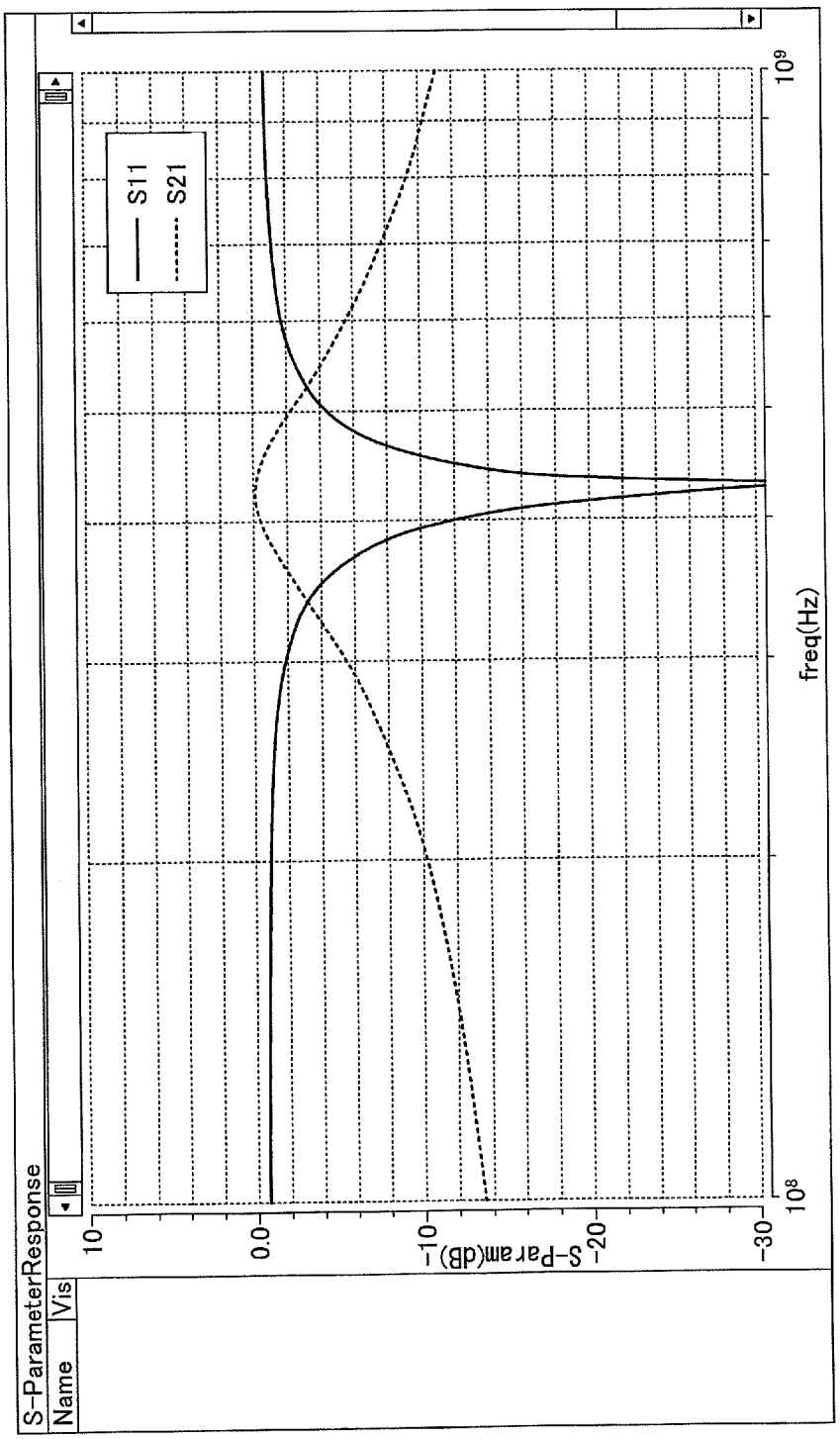
FIG. 7 illustrates signal transmission properties of a case where the switch is turned off in the transmission circuit.
Figure 8:
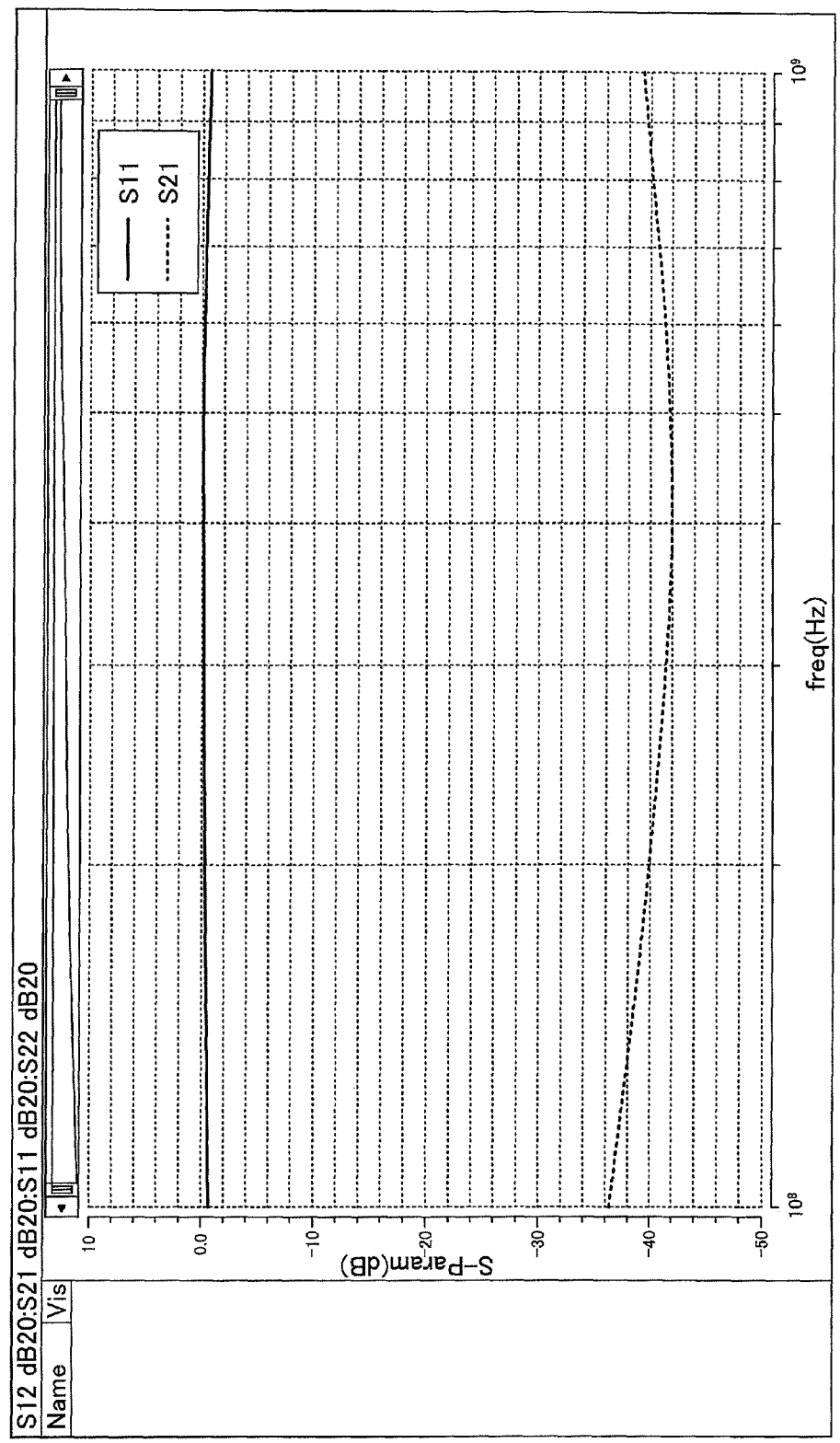
FIG. 8 illustrates signal transmission properties of a case where the switch is turned on in the transmission circuit.

Here, with reference to FIGS. 7 and 8, a description is given of signal transmission properties in a case where the switch 130 is switched between on/off in the transmission circuit 100.

FIG. 7 illustrates signal transmission properties of a case where the switch 130 is turned off in the transmission circuit 100. FIG. 8 illustrates signal transmission properties of a case where the switch 130 is turned on in the transmission circuit 100.

The signal transmission properties (S11 parameter, S21 parameter) in FIGS. 7 and 8 are obtained by setting the terminal 101 as port1, connecting a balun for performing an ideal single-differential conversion to the terminals 102p, 102n, and setting the terminal for outputting RF signals of the single end format from this balun as port2. Note that port1 and port2 are connected to ground.

The S11 parameter and the S21 parameter illustrated in FIGS. 7 and 8 are obtained by a simulation, upon obtaining the capacitances C1, C2, C3, and the inductances L1, L2, L3 that satisfy the formulas (3), (4), (5), (6).

Note that in this case, as an example, as for the S11 parameter, a frequency band of less than or equal to −10 dB is evaluated as a favorable frequency band with a small amount of reflections of signals. Furthermore, as for the S21 parameter, a frequency band of greater than or equal to −3 dB is evaluated as a favorable frequency band with a small amount of transmission loss.

When the switch 130 is turned off, as indicated by a solid line in FIG. 7, the S11 parameter is less than or equal to −10 dB in a frequency band that is substantially centered around 430 MHz (approximately 3.9 MHz through approximately 4.5 MHz).

As indicated by a dashed line in FIG. 7, the S21 parameter is greater than or equal to −3 dB in a frequency band that is substantially centered around 430 MHz (approximately 3.9 MHz through approximately 4.5 MHz).

Therefore, when the switch 130 is turned off, it has been found that a good transmission state of RF signals is attained in the frequency band including a resonance frequency of around f=4.3 MHz, between the terminal 101 and the terminals 102p, 102n.

Furthermore, when the switch 130 is turned on, by indicated by a solid line in FIG. 8, the S11 parameter is approximately 0 dB, regardless of the frequency.

Furthermore, as indicated by a dashed line in FIG. 8, the S21 parameter is less than or equal to −36 dB.

Therefore, when the switch 130 is turned on, the part between the terminal 101 and the terminals 102p, 102n is blocked, and a state of High-Z is attained.

As described above, in the transmission circuit 100 according to the first embodiment, by turning off the switch 130, it is possible to transmit RF signals between the terminal 101 and the terminals 102p, 102n, perform single-differential conversion, and supply a bias.

Furthermore, in the transmission circuit 100 according to the first embodiment, by turning on the switch 130, it is possible to block the part between the terminal 101 and the terminals 102p, 102n.

Furthermore, in the transmission circuit 100 according to the first embodiment, when the switch 130 is turned off and RF signals are transmitted between the terminal 101 and the terminals 102p, 102n, the RF signals do not pass through the switch 130, and therefore the loss of RF signals is significantly reduced.

This is a significant difference in comparison to the assumed technology, in which the switches 22, 32 are included in the transmission paths of signals in the transmission circuit 20 (see FIG. 2) and the transmission circuit 30 (see FIG. 3), respectively.

As described above, according to the first embodiment, it is possible to provide the transmission circuit 100 in which the loss is reduced.

Therefore, in the RF transceiver 500 according to the first embodiment illustrated in FIG. 4, by alternately controlling the on/off of the switches 130Tx, 130Rx of the transmission circuits 100Tx, 100Rx, the RF signals may be transmitted only by either one of the transmission circuits 100Tx, 100Rx.

In this case, the RF signals do not pass through the switch 130, and therefore the loss of RF signals is significantly reduced.

Furthermore, in the transmission circuit 100 according to the first embodiment, the switch 130 is not included in the transmission path of RF signals, and therefore there is no need to use a switch constructed by a MMIC of low loss, such as the switches 22, 32 of the transmission circuits 20, (see FIGS. 2, 3) of the assumed technology.

Therefore, it is possible to dispose the switch 130 inside the LSI 510, which is realized by a semiconductor integrated circuit device that is mainly made of silicon.

Furthermore, in the transmission circuit 100 according to the first embodiment, the circuits 110, 120 are for performing single-differential conversion on signals, impedance matching, and for supplying a bias voltage.

Therefore, it is possible to reduce the number of components relative to that of the transmission circuits 20, 30 (see FIGS. 2, 3) of the assumed technology. Therefore, the size of the circuit may be more compact than that of the transmission circuits 20, 30 (see FIGS. 2, 3) of the assumed technology. The components outside the LSI 510 have a relatively large mounting area, and therefore a reduced number of components outside the LSI 510 is significantly advantageous in terms of reducing the size.

Note that in the above description, the transmission circuit 100 (100Tx, 100Rx) according to the first embodiment is included in both the transmission system and the reception system, as in the RF transceiver 500 illustrated in FIG. 4. However, the RF transceiver 500 may be modified as follows.

Figure 9:
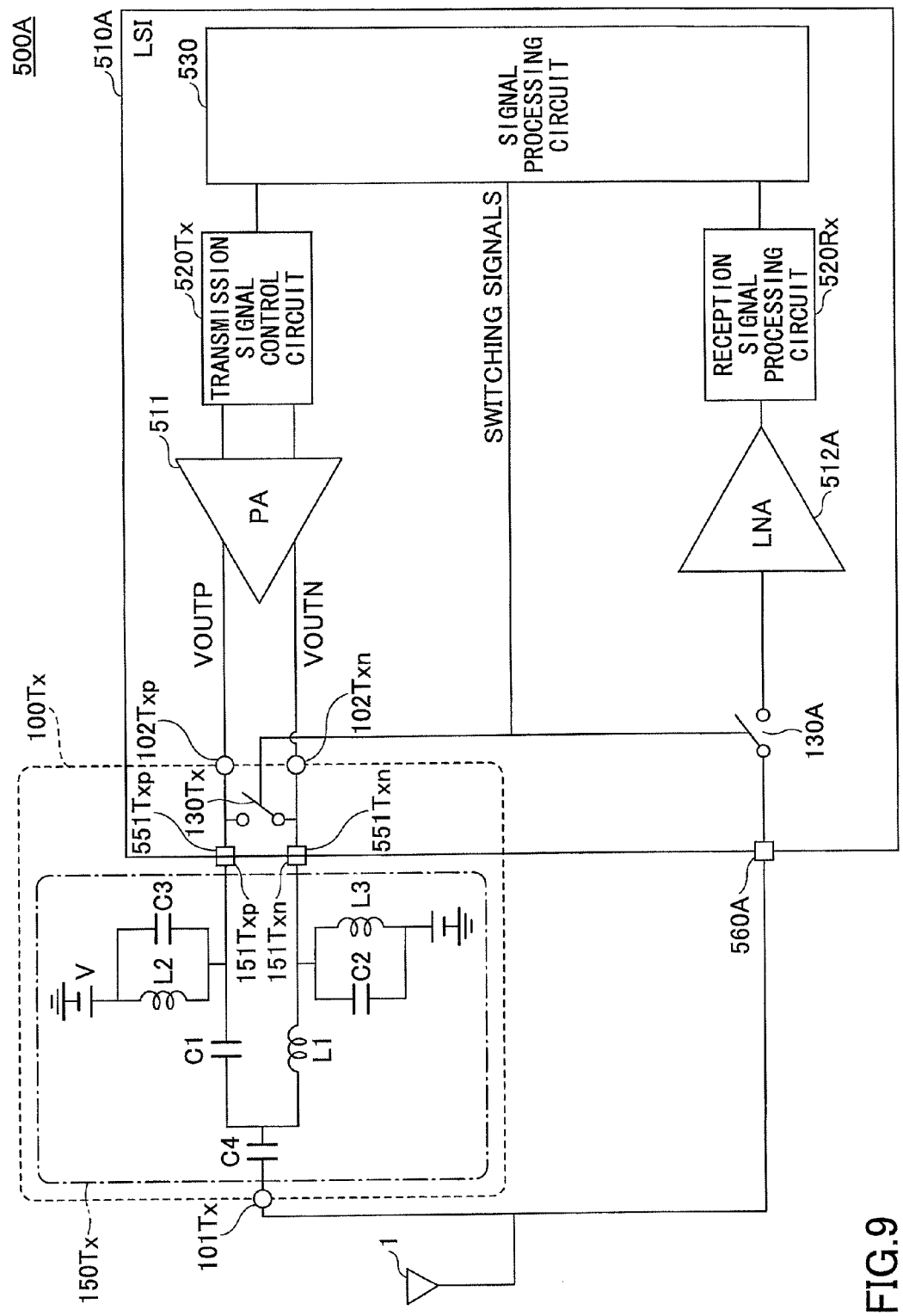
FIG. 9 illustrates a RF transceiver according to a modification of the first embodiment.

FIG. 9 illustrates a RF transceiver 500A according to a modification of the first embodiment.

As illustrated in FIG. 9, the RF transceiver 500A may include only the transmission circuit 100Tx of the transmission system, and as the reception system, the antenna 1 and an LNA 512A may be connected via a terminal 560 of an LSI 510A and a switch 130A inside the LSI 510A. In this case, the reception system inputs RF signals of the single end form in the signal processing circuit 530.

Furthermore, conversely, the RF transceiver 500A may include only the transmission circuit 100Rx of the reception system, and the transmission system may input RF signals of a single end form in the signal processing circuit 530.

Second Embodiment

Figure 10:
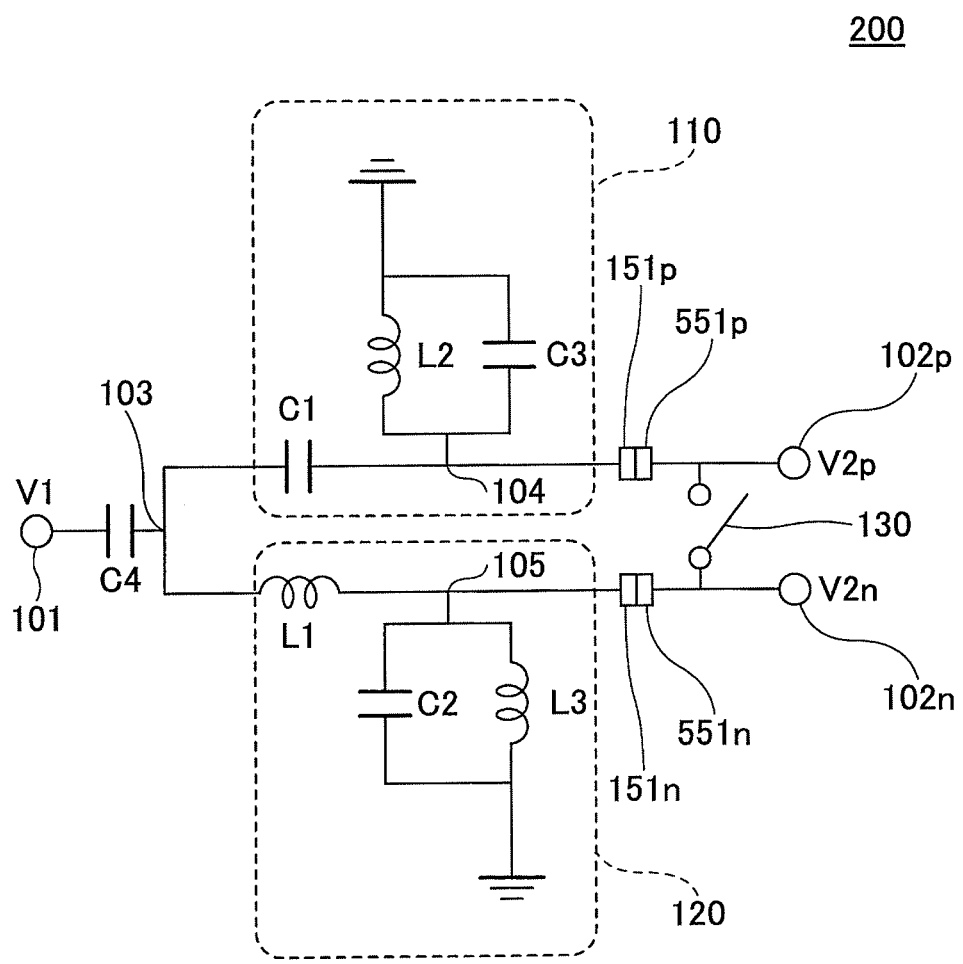
FIG. 10 illustrates a transmission circuit according to a second embodiment.

FIG. 10 illustrates a transmission circuit 200 according to a second embodiment. The transmission circuit 200 has a configuration in which the DC power source V inside the circuit 110 and the DC power source V inside the circuit 120 are removed from the transmission circuit 100 (see FIG. 5) according to the first embodiment.

Other configurations are the same as those of the transmission circuit 100 according to the first embodiment, and therefore the same configuration elements are denoted by the same reference numerals and descriptions thereof are omitted.

The transmission circuit 200 according to the second embodiment does not include the DC power source V inside the circuit 110 or the DC power source V inside the circuit 120, and thus does not have a function of supplying a bias voltage, compared to the circuits 110, 120 of the transmission circuit 100 according to the first embodiment.

Therefore, the circuits 110, 120 are for performing single-differential conversion on the signals and impedance matching.

The transmission circuit 200 as described above may be used when the PA of the LSI or the LNA of the RF transceiver has a bias supplying function.

In the transmission circuit 200, when the switch 130 is turned off and RF signals are transmitted between the terminal 101 and the terminals 102p, 102n, the RF signals do not pass through the switch 130, and therefore the loss of RF signals is significantly reduced.

As described above, according to the second embodiment, it is possible to provide the transmission circuit 200 in which the loss is reduced.

Third Embodiment

Figure 11:
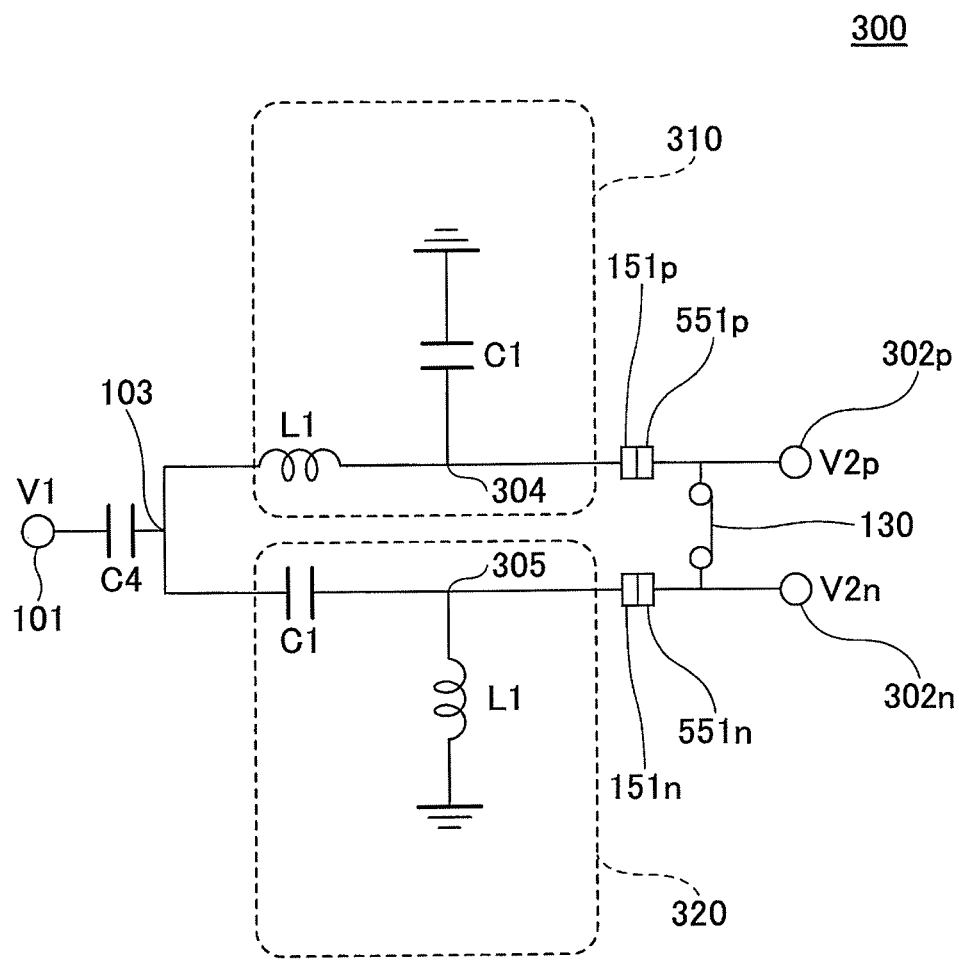
FIG. 11 illustrates a transmission circuit according to a third embodiment.

FIG. 11 illustrates a transmission circuit 300 according to a third embodiment. The transmission circuit 300 includes a terminal 101, circuits 310, 320, a switch 130, and terminals 302p, 302n. In the following, the same configuration elements as those of the transmission circuits 100, 200 are denoted by the same reference numerals and descriptions thereof are omitted.

The terminal 101 is the same as the terminal 101 of the transmission circuit 100 according to the first embodiment, and is connected to the antenna 1 (see FIG. 4).

The circuits 310, 320 include an inductor L1 and a capacitor C1, respectively.

The inductor L1 of the circuit 310 is serially inserted between the terminal 101 and the terminal 302p. Furthermore, the capacitor C1 of the circuit 310 is serially inserted between a branch point 304 and a power source terminal.

The capacitor C1 of the circuit 320 is serially inserted between the terminal 101 and the terminal 302n. Furthermore, the inductor L1 of the circuit 310 is serially inserted between a branch point 305 and a ground terminal.

The switch 130 is connected between the terminals 302p, 302n.

The transmission circuit 300 as described above has a circuit configuration in which the positions of the inductor L1 and the capacitor C1 of the circuit 310 and the capacitor C1 and the inductor L1 of the circuit 320 are switched.

The purpose of this configuration is to attain impedance matching between the inductor L1 and the capacitor C1 of the circuit 310 and the capacitor C1 and the inductor L1 of the circuit 320, and to realize single-differential conversion.

That is to say, when the switch 130 is turned off, the phase of the signal of the positive side of the differential signals input from the terminal 302p is advanced by 90 degrees by the inductor L1 and the capacitor C1 of the circuit 310. Furthermore, the phase of the signal of the negative side of the differential signals input from the terminal 302n is delayed by 90 degrees by the capacitor C1 and the inductor L1 of the circuit 320.

Therefore, when the switch 130 is turned off, the RF signals of the differential form input to the terminals 302p, 302n may be converted into RF signals of the single end form, and output from the terminal 101.

Furthermore, when the switch 130 is turned off, the RF signals of the single end form input from the terminal 101 may be converted into RF signals of the differential form by the circuits 310, 320, and output from the terminals 302p, 302n.

As described above, in the transmission circuit 300, when the switch 130 is turned off and RF signals are transmitted between the terminal 101 and the terminals 302p, 302n, the RF signals do not pass through the switch 130, and therefore the loss of RF signals is significantly reduced.

Furthermore, by turning on the switch 130, by a loop-type LC resonance circuit constructed by the inductor L1 of the circuit 310 and the capacitor C1 of the circuit 320, the part between the terminal 101 and the terminals 302p, 302n becomes High-Z.

Therefore, the transmission circuit 300 may operate in the same manner as the transmission circuits 100, 200 of the first and second embodiments.

As described above, according to the third embodiment, it is possible to provide the transmission circuit 300 in which the loss is reduced.

The present invention is not limited to the transmission circuits and the signal transmission and reception circuits according to the specific embodiments described herein, and variations and modifications may be made without departing from the scope of the present invention.

According to an aspect of the embodiments, a transmission circuit and a signal transmission and reception circuit are provided, in which loss is reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A transmission circuit comprising:
    a first terminal for inputting or outputting signals;
    a pair of second terminals for outputting or inputting the signals;
    a first path that connects the first terminal and one of the pair of second terminals;
    a second path that connects the first terminal and another one of the pair of second terminals;
    a first circuit including a first capacitor that is serially inserted in the first path, the first capacitor being inserted between the first terminal and the one of the pair of second terminals, the first circuit being configured to perform single-differential conversion on signals transmitted through the first path, to perform impedance matching, and to supply a bias voltage;
    a second circuit including a first inductor that is serially inserted in the second path, the first inductor being inserted between the first terminal and the other one of the pair of second terminals, the second circuit being configured to perform single-differential conversion on signals transmitted through the second path, to perform impedance matching, and to supply a bias voltage; and
    a switch that is connected between the one of the pair of second terminals and the other one of the pair of second terminals,
    wherein
    the first circuit includes:
        the first capacitor,
        a first branch path that branches from between the first capacitor and the one of the pair of second terminals, and that is connected to a reference potential point,
        a first parallel circuit that is serially inserted in the first branch path, the first parallel circuit including a second inductor and a second capacitor, and
        a first DC power source that is serially inserted in the first branch path, between the first parallel circuit and the reference potential point, and wherein
    the second circuit includes:
        the first inductor,
        a second branch path that branches from between the first inductor and the other one of the pair of second terminals, and that is connected to the reference potential point,
        a second parallel circuit that is serially inserted in the second branch path, the second parallel circuit including a third inductor and a third capacitor, and
        a second DC power source that is serially inserted in the second branch path, between the second parallel circuit and the reference potential point.

2. The transmission circuit according to claim 1, wherein a resonance frequency that is determined according to a capacitance of the first capacitor and an inductance of the first inductor is equal to a resonance frequency of the signals transmitted through the first path and the second path.

3. The transmission circuit according to claim 1, further comprising:
    a fourth capacitor that is inserted between the first terminal, and the first capacitor and the first inductor.

4. A transmission circuit comprising:
a first terminal for inputting or outputting signals;
a pair of second terminals for outputting or inputting the signals;
a first path that connects the first terminal and one of the pair of second terminals;
a second path that connects the first terminal and another one of the pair of second terminals;
a first circuit including a first capacitor that is serially inserted in the first path, the first capacitor being inserted between the first terminal and the one of the pair of second terminals, the first circuit being configured to perform single-differential conversion on signals transmitted through the first path, and to perform impedance matching;
a second circuit including a first inductor that is serially inserted in the second path, the first inductor being inserted between the first terminal and the other one of the pair of second terminals, the second circuit being configured to perform single-differential conversion on signals transmitted through the second path, and to perform impedance matching; and
a switch that is connected between the one of the pair of second terminals and the other one of the pair of second terminals,
wherein
the first circuit includes:
the first capacitor,
a first branch path that branches from between the first capacitor and the one of the pair of second terminals, and that is connected to a reference potential point, and
a first parallel circuit that is serially inserted in the first branch path, the first parallel circuit including a second inductor and a second capacitor, and
wherein
the second circuit includes:
the first inductor,
a second branch path that branches from between the first inductor and the other one of the pair of second terminals, and that is connected to the reference potential point, and
a second parallel circuit that is serially inserted in the second branch path, the second parallel circuit including a third inductor and a third capacitor.

5. A signal transmission and reception circuit comprising:
a signal transmission and reception terminal;
a transmitting circuit configured to include a pair of output terminals and to transmit signals; and
the transmission circuit according to claim 1, wherein the transmission circuit is provided between the signal transmission and reception terminal and the transmitting circuit, and wherein the first terminal is connected to the signal transmission and reception terminal, and the pair of second terminals are connected to the pair of output terminals of the transmitting circuit.

6. The signal transmission and reception circuit according to claim 5, wherein
the switch and the transmitting circuit are realized as a single semiconductor circuit device.

7. A signal transmission and reception circuit comprising:
a signal transmission and reception terminal;
a receiving circuit configured to include a pair of input terminals and to receive signals; and
the transmission circuit according to claim 1, wherein the transmission circuit is provided between the signal transmission and reception terminal and the receiving circuit, and wherein the first terminal is connected to the signal transmission and reception terminal, and the pair of second terminals are connected to the pair of input terminals of the receiving circuit.

8. The signal transmission and reception circuit according to claim 7, wherein
the switch and the receiving circuit are realized as a single semiconductor circuit device.

9. A transmission circuit comprising:
a first path that connects a first terminal for inputting or outputting signals, and one of a pair of second terminals for outputting or inputting the signals;
a second path that connects the first terminal and another one of the pair of second terminals;
a first capacitor that is serially inserted in the first path;
a first inductor that is serially inserted in the second path;
a first branch path that branches from between the first capacitor of the first path and the one of the pair of second terminals, and that is connected to a reference potential point;
a first parallel circuit that is serially inserted in the first branch path, the first parallel circuit including a second inductor and a second capacitor;
a first DC power source that is serially inserted in the first branch path, between the first parallel circuit and the reference potential point;
a second branch path that branches from between the first inductor of the second path and the other one of the pair of second terminals, and that is connected to the reference potential point;
a second parallel circuit that is serially inserted in the second branch path, the second parallel circuit including a third inductor and a third capacitor;
a second DC power source that is serially inserted in the second branch path, between the second parallel circuit and the reference potential point; and
a switch that is connected between the one of the pair of second terminals and the other one of the pair of second terminals.

10. The transmission circuit according to claim 9, wherein
a resonance frequency that is determined according to a capacitance of the first capacitor and an inductance of the first inductor is equal to a resonance frequency of the signals transmitted through the first path and the second path.

11. A signal transmission and reception circuit comprising:
a signal transmission and reception terminal;
a transmitting circuit configured to include a pair of output terminals and to transmit signals; and
the transmission circuit according to claim 9, wherein the transmission circuit is provided between the signal transmission and reception terminal and the transmitting circuit, and wherein the first terminal is connected to the signal transmission and reception terminal, and the pair of second terminals are connected to the pair of output terminals of the transmitting circuit.

12. The signal transmission and reception circuit according to claim 11, wherein
the switch and the transmitting circuit are realized as a single semiconductor circuit device.

13. A signal transmission and reception circuit comprising:
a signal transmission and reception terminal;
a receiving circuit configured to include a pair of input terminals and to receive signals; and
the transmission circuit according to claim 10, wherein the transmission circuit is provided between the signal transmission and reception terminal and the receiving circuit, and wherein the first terminal is connected to the signal transmission and reception terminal, and the pair of second terminals are connected to the pair of input terminals of the receiving circuit.

14. The signal transmission and reception circuit according to claim 13, wherein
the switch and the receiving circuit are realized as a single semiconductor circuit device.

15. The signal transmission and reception circuit according to claim 9, further comprising:
a first circuit including the first capacitor that is serially inserted in the first path, the first capacitor being inserted between the first terminal and the one of the pair of second terminals, the first circuit being configured to perform single-differential conversion on signals transmitted through the first path, to perform impedance matching, and to supply a bias voltage; and
a second circuit including the first inductor that is serially inserted in the second path, the first inductor being inserted between the first terminal and the other one of the pair of second terminals, the second circuit being configured to perform single-differential conversion on signals transmitted through the second path, to perform impedance matching, and to supply a bias voltage.

* * * * *